(12) United States Patent
Talgorn et al.

(10) Patent No.: US 11,628,638 B2
(45) Date of Patent: Apr. 18, 2023

(54) STITCHING BY INSERTING CURABLE COMPLIANT MATERIALS OF PARTS PRODUCED VIA ADDITIVE MANUFACTURING TECHNIQUES FOR IMPROVED MECHANICAL PROPERTIES

(71) Applicant: SIGNIFY HOLDING B.V., Eindhoven (NL)

(72) Inventors: Elise Claude Valentine Talgorn, Eindhoven (NL); Olaf Van Der Sluis, Eindhoven (NL); Manuela Lunz, Eindhoven (NL)

(73) Assignee: SIGNIFY HOLDING B.V., Eindhoven (NL)

(*) Notice: Subject to any disclaimer, the term of this patent is extended or adjusted under 35 U.S.C. 154(b) by 393 days.

(21) Appl. No.: 16/859,171

(22) Filed: Apr. 27, 2020

(65) Prior Publication Data

US 2020/0298507 A1 Sep. 24, 2020

Related U.S. Application Data

(62) Division of application No. 15/554,117, filed as application No. PCT/EP2016/053328 on Feb. 17, 2016, now Pat. No. 10,661,514.

(30) Foreign Application Priority Data

Mar. 3, 2015 (EP) ..................................... 15157291

(51) Int. Cl.
*B29C 70/74* (2006.01)
*B33Y 80/00* (2015.01)
(Continued)

(52) U.S. Cl.
CPC .......... *B29C 70/745* (2013.01); *B29C 64/112* (2017.08); *B29C 64/118* (2017.08);
(Continued)

(58) Field of Classification Search
CPC ... B29C 70/745; B29C 64/112; B29C 64/118; B29C 67/004; B33Y 10/00; B33Y 80/00;
(Continued)

(56) References Cited

U.S. PATENT DOCUMENTS 5,700,406 A 12/1997 Menhennett et al.
2003/0186042 A1 10/2003 Dunlap et al.
(Continued)

FOREIGN PATENT DOCUMENTS

EP 2703149 A1 3/2014
WO WO2009013751 A2 1/2009

OTHER PUBLICATIONS

B. Huang, et al., "Raster Angle Mechanics in Fused Deposition Modelling", Journal of Composite Materials, Downloaded from jcm.sagepub.com at Eindhoven Univ of Technology Feb. 3, 2014, pp. 1-21.

(Continued)

*Primary Examiner* — Brian Handville

(57) ABSTRACT

The invention provides a method for the production of a 3D printed object (100), wherein the method comprises (i) a 3D printing stage, the 3D printing stage comprising 3D printing a 3D printable material (110) to provide the 3D printed object (100) of printed material (120), wherein the 3D printing stage further comprises forming during 3D printing a channel (200) in the 3D printed object (100) under construction, wherein the method further comprises (ii) a filling stage comprising filling the channel (200) with a curable material (140) and curing the curable material (140) to provide the channel (200) with cured material (150), wherein the cured material (150) has a lower stiffness than the surrounding printed material (120).

13 Claims, 7 Drawing Sheets

(51) Int. Cl.
  *B33Y 10/00* (2015.01)
  *B29C 64/118* (2017.01)
  *B29C 67/00* (2017.01)
  *B29C 64/112* (2017.01)

(52) U.S. Cl.
  CPC ............ *B29C 67/004* (2013.01); *B33Y 10/00* (2014.12); *B33Y 80/00* (2014.12); *B29K 2995/007* (2013.01); *Y10T 428/24033* (2015.01); *Y10T 428/24942* (2015.01); *Y10T 428/249923* (2015.04)

(58) Field of Classification Search
  CPC ....... B29K 2995/007; Y10T 428/24033; Y10T 428/24942; Y10T 428/249923
  See application file for complete search history.

(56) References Cited

U.S. PATENT DOCUMENTS

| | | | |
|---|---|---|---|
| 2004/0187714 A1 | 9/2004 | Napadensky et al. | |
| 2007/0179657 A1 | 8/2007 | Holzwarth | |
| 2012/0133080 A1 | 5/2012 | Moussa et al. | |
| 2013/0073068 A1 | 3/2013 | Napadensky | |
| 2013/0303002 A1 | 11/2013 | Oosterhuis et al. | |
| 2014/0192498 A1 | 7/2014 | Rathburn | |
| 2014/0291886 A1 | 10/2014 | Mark et al. | |
| 2014/0361460 A1* | 12/2014 | Mark ................ | B29C 48/0022 264/248 |

OTHER PUBLICATIONS

M-L Lu, et al., "Fracture Toughness of Acrylonitrile-Butadiene-Styrene by J-Integral Methods", Institute of Applied Chemistry National Chiao Tung University, Hsin-Chu, Taiwan, Republic of China, Polymer Engineering and Science, Sep. 1995, vol. 35, No. 18, pp. 1433-1439.

M. Ortiz, et al., "Finite-Deformation Irreversible Cohesive Elements for Three-Dimensional Crack-Propagation Analasis", International Journal for Numeric Methods in Engineering 44, 1997, pp. 1267-1282.

J.F. Rodriguez, et al., "Mechanical Behavior of Acrylonitrile Butadiene Styrene (ABS) Fused Deposition Materials, Experimental Investigation", Rapid Prototyping Journal, vol. 7, No. 3, 2001, pp. 148-158.

O. van der Sluis, et al., "Advances in Delamination Modeling", Nanopackaging: Nanotechnologies and Electronics Packaging, Springer Science and Business Media, LLC, 2008, pp. 61-91.

\* cited by examiner and# STITCHING BY INSERTING CURABLE COMPLIANT MATERIALS OF PARTS PRODUCED VIA ADDITIVE MANUFACTURING TECHNIQUES FOR IMPROVED MECHANICAL PROPERTIES

FIELD OF THE INVENTION

The invention relates to a method for the production of a 3D printed object. The invention also relates to such object per se, for instance obtainable with such method.

BACKGROUND OF THE INVENTION

Additive technologies wherein a material is incorporated in an object made via such technology are known in the art. US2013303002, for instance describes a three-dimensional interconnect structure for micro-electronic devices and a method for producing such an interconnect structure. The method comprises a step wherein a backbone structure is manufactured using an additive layer-wise manufacturing process. The backbone structure comprises a three-dimensional cladding skeleton and a support structure. The cladding skeleton comprises layered freeform skeleton parts that will form the electric interconnections between the electric contacts of the interconnect structure after a conductive material is applied on the backbone structure. The support structure supports the layered freeform skeleton parts. Parts of the support structure may be removed to isolate and/or expose the electric interconnections. The cladding skeleton can be embedded by an insulating material for providing a further support. Amongst others, the cladding skeleton parts form a single connected tube that is cladded on an inside surface by flushing a plating fluid trough the tube for forming the electric interconnections.

Additive manufacturing (AM) is a growing field of materials processing. It can be used for rapid prototyping, customization, late stage configuration, or making small series in production. For 3D inkjet printing or dispensing, a liquid monomer mixture may be used and by photo polymerization the shape is then fixed before the following layer is deposited.

U.S. Pat. No. 5,700,406 discloses an method for manufacturing an article wherein a cavity if formed by jetting droplets of liquid build material onto a platform, and wherein the cavity is filled with a curable material to form a solid portion of the article Most of AM technologies produce objects with mechanical properties inferior to that of objects produced by conventional manufacturing processes. For instance, in-plane and out-of-plane mechanical properties of AM structures may be inferior to injection molding (IM) structures/materials due to high anisotropic behavior of these objects. Further, low in-plane properties are a result of the heterogeneity of the structure. For example, in Fused Deposition Modelling (FDM), the heterogeneity is caused by the shape of the fibers and the voids in between the fibers. This induces e.g. localization of deformation in the fiber, possibly leading to fiber fracture, and possible detachment of fibers. Yet, low out-of-plane properties are a result of the heterogeneity of the structure and of the process: due to the time difference (and thus temperature difference) in the layer-by-layer processing, the adhesion between layers is lower than the adhesion between fibers within the layers. Hence, not only the deformation is localized in the fiber and the fibers detach, but also the layers (partly) detach. Especially the inelastic properties suffer from these occurring phenomena (as we are talking about fiber fracture and detachment which do not occur in the elastic regime).

SUMMARY OF THE INVENTION

Hence, it is an aspect of the invention to provide an alternative method for 3D printing, which preferably further at least partly obviates one or more of above-described drawbacks. It is also an aspect of the invention to provide an alternative 3D printed object, which preferably further at least partly obviates one or more of above-described drawbacks.

Herein, we propose to introduce e.g. stitches, or other types of reinforcing structures, in AM produced objects to improve their mechanical properties. The stitches, or other types of reinforcing structures, are made of material with a high compliance (i.e. low stiffness) and ductility (i.e. large strain to break). This may result in e.g. (a) lower stresses (due to compliance of the inserted material) in the fibers thereby preventing, or postponing, localization of deformation and fracture of the fibers, (ii) improved out-of-plane mechanical integrity of the material, and (iii) that the inserted material functions as crack stopper, due to its high ductility. The stitches, etc., may be produced by filling cavities in the printed objects with a low viscosity material that can be cured at a later stage. Such cavities may be deliberately induced in the 3D object during printing.

One could envision including a "conventional" stitching process in the additive manufacturing machine, however the "conventional" stitches add to the thickness of the part. For clothes, for example, this does not matter as the material itself as well as the stitching thread is soft and flexible, so that in the final product no unevenness due to the stitches is felt. For other, harder and stiff materials this might however be a problem. Also, stitching in a "conventional way" might be complicated as it requires making holes in the manufactured part. To avoid those problems, with 3D design and printing the stitches, or other types of reinforcing structures, can be introduced inside the material as shown below also with the help of sacrificial layers as discussed further below.

In a first aspect, the invention provides a method for the production of a 3D printed object ("object" or "3D object"), wherein the method comprises (i) a 3D printing stage wherein a 3D printable material ("printable material") is 3D printed to provide the 3D printed object, and wherein during 3D printing a channel is formed in the 3D printed object (which is under construction), the channel comprising two or more channel parts, each channel part having a channel axis, and two or more channel axes having a mutual angle larger than 0° and smaller than 180°, and wherein the method further comprises a filling stage wherein the channel is filled with a curable material and wherein the curable material is cured to provide the channel with cured material, the cured material having a lower stiffness than the surrounding printed material. The channel may thereby provide a reinforcing structure, substantially embedded in the printed 3D object.

With such method, a 3D printed object can be obtained that has a higher strength. Delamination, for instance, may be inhibited by the channel filled with cured material. Such channel may be used and configured as a kind of stitch and/or anchor. A further advantage of the invention is that the channels, which may (thus) also be indicated as reinforcing channels, may be configured in such a way, that they are not visible from the outside. This may add to the appearance of the object and may also provide more smooth surfaces.

The terms "3D printed object" or "3D object" refer to a three dimensional object obtained via 3D printing (which is an additive manufacturing process), such as an object having a height, a width and a length. The 3D object can in principle be any object that is 3D printable. It can be an item with a use function or a purely decorative item. It can be a scale model of an item such as a car, a house, a building, etc. Further, the 3D object can be a piece or element for use in another device or apparatus, such as a lens, a mirror, a reflector, a window, a collimator, a waveguide, a color converting element (i.e. comprising a luminescent material), a cooling element, a locking element, an electrically conducting element, a casing, a mechanical support element, a sensing element, etc. The 3D printed object comprises 3D printed material.

Additive Manufacturing (AM) is a group of processes making three-dimensional objects from a 3D model or other electronic data source primarily through additive processes. The additive process can involve the binding of grains (via sintering, melting, or gluing) or of layers of material (via successive deposition or production of the layers, e.g. polymerization). In the case of selective melting of metal grains, it is possible to produce objects with similar density and structure as objects produced by conventional manufacturing processes. In the other cases, the objects are composed of grains or layers separated by interfaces that will influence the properties of the object.

A widely used additive manufacturing technology is the process known as Fused Deposition Modeling (FDM). Fused deposition modeling (FDM) is an additive manufacturing technology commonly used for modeling, prototyping, and production applications. FDM works on an "additive" principle by laying down material in layers; a plastic filament or metal wire is unwound from a coil and supplies material to produce a part. Possibly, (for thermoplastics for example) the filament is melted and extruded before being laid down. FDM is a rapid prototyping technology. Another term for FDM is "fused filament fabrication" (FFF). Herein, the term "filament 3D printing" (FDP) is applied, which is considered to be equivalent to FDM or FFF. In general, FDM printers use a thermoplastic filament, which is heated to its melting point and then extruded, layer by layer, (or in fact filament after filament) to create a three dimensional object. FDM printers can be used for printing complicated object. Hence, in an embodiment the method includes production of the 3D printed object via an FDM 3D printing.

Materials that may especially qualify as 3D printable materials may be selected from the group consisting of metals, glasses, thermoplastic polymers, silicones, etc. Especially, the 3D printable material comprises a (thermoplastic) polymer selected from the group consisting of ABS (acrylonitrile butadiene styrene), Nylon (or polyamide), Acetate (or cellulose), PLA (poly lactic acid), terephthalate (such as PET polyethylene terephthalate), Acrylic (polymethylacrylate, Perspex, polymethylmethacrylate, PMMA), Polypropylene (or polypropene), Polystyrene (PS), PE (such as expanded-high impact-Polythene (or polyethene), Low density (LDPE) High density (HDPE)), PVC (polyvinyl chloride) Polychloroethene, etc. Optionally, the 3D printable material comprises a 3D printable material selected from the group consisting of Urea formaldehyde, Polyester resin, Epoxy resin, Melamine formaldehyde, Polycarbonate (PC), rubber, etc. Optionally, the 3D printable material comprises a 3D printable material selected from the group consisting of a polysulfone, a polyether sulfone, a polyphenyl sulfone, an imide (such as a poly ether imide) etc.

The 3D printed object is especially (at least partly) made from 3D printable material (i.e. material that may be used for 3D printing). The term "3D printable material" may also refer to a combination of two or more materials. In general these (polymeric) materials have a glass transition temperature $T_g$ and/or a melting temperature $T_m$. The 3D printable material will be heated by the 3D printer before it leaves the nozzle to a temperature of at least the glass transition temperature, and in general at least the melting temperature. Hence, in an embodiment the 3D printable material comprises a thermoplastic polymer, such as having a glass transition temperature ($T_g$) and/or a melting point ($T_m$), and the printer head action comprises heating the one or more of the receiver item and 3D printable material deposited on the receiver item to a temperature of at least the glass transition temperature, especially to a temperature of at least the melting point. In yet another embodiment, the 3D printable material comprises a (thermoplastic) polymer having a melting point ($T_m$), and the printer head action comprises heating the one or more of the receiver item and 3D printable material deposited on the receiver item to a temperature of at least the melting point. Specific examples of materials that can be used (herein) can e.g. be selected from the group consisting of acrylonitrile butadiene styrene (ABS), polylactic acid (PLA), polycarbonate (PC), polyamide (PA), polystyrene (PS), lignin, rubber, etc. Other examples of materials that can be used can e.g. be selected from the group consisting of metal, clay, concrete, etc.

The 3D printing technique used herein is not limited to FDM. Other 3D printing techniques that may also be applied in the invention may e.g. be selected from stereo lithography, powder binding, ink-jetting, etc. An extrusion based process such as FDM may be applied, wherein amongst others one or more of thermoplastics (e.g. PLA, ABS), HDPE, eutectic metals, rubber, silicone, porcelain, etc. may be applied. Another extrusion based process, such as robocasting may also be applied, wherein amongst others one or more of a ceramic material, a metal alloy, a cermet, a metal matrix composite, a ceramic matrix composite, etc. may be applied. Electron beam freeform fabrication (EBF3) or direct metal laser sintering (DMLS) may be applied, wherein especially a metal alloy may be applied. Further, (granular-based) processes such as electron-beam melting (EBM) (especially with a metal alloy), selective laser melting (SLM) (especially with a metal or a metal alloy), selective laser sintering (SLS) (especially with a thermoplastic powder), etc., may be applied. Further, powder bed and inkjet head 3D printing may be applied, such as plaster-based 3D printing (PP), with e.g. plaster. Also laminated object manufacturing (LOM), with e.g. paper, metal foil or plastic film, may be applied. Further stereo lithography (SLA) or digital light processing (DLP), with e.g. a photopolymer, may be applied, etc.

Especially, however, the method includes printing of polymers, i.e. the printable material and the curable material may comprise polymeric material, especially differing from each other.

In a specific embodiment the curable material may comprise one or more of a polysiloxane, a polysilazane, a polyurethane, an epoxy, a polyamide, a polyimide, a polyester, and an acrylate; especially a silicone-type polymer, such as PDMS. In yet a further embodiment (see also above), the 3D printable material may comprises one or more of a polymeric material selected from the group consisting of ABS, polystyrene and polycarbonate (PC). The printable material may also comprise other materials (see also above and below). The printable material may be solid at room temperature, but upon heating may become printable (i.e. especially flowable). Downstream from a printer nozzle, optionally further heating may be applied, for instance to cure the printable material.

The terms "upstream" and "downstream" relate to an arrangement of items or features relative to the propagation of the printable material from a printable material generating means (here especially the nozzle of the 3D printer (head)), wherein relative to a first position within a flow of the printable material from the printable material generating means, a second position in the flow of the printable material closer to the printable material generating means is "upstream", and a third position within the flow of printable material further away from the printable material generating means is "downstream".

In general, the channel will not be a straight channel, without any curvatures relative to a channel axis. The channel will in general have a plurality of curvatures and/or other means to improve integrity of the 3D object. Of course, the 3D object may include a plurality of channels. The term "channel" may thus also refer to a plurality of channels.

The channel comprises two or more channel parts forming said channel, wherein each channel part has a channel axis, and wherein two or more channel axes have a mutual angle ($\alpha$) larger than 0° and smaller than 180°. The channel may also comprise at least three channel parts having at least three channel axes having mutual angles ($\alpha$) larger than 0° and smaller than 180°. By including curvatures, one may further support that different parts of the 3D object may not easily break; the channels, more precisely the cured material inside the channels may keep the parts together. Especially, the channel may be configured as meandering structure in the 3D object. An example thereof may be a stitch, such as a chain stitch. Especially, the channel may comprise two channel parts having a channel (part) axis having an acute angle; even more especially the channel may comprise three or more channel parts having channel (part) axes having acute angle. As indicated above, such channels may not be visible from the outside of the object.

The channels are especially substantially entirely filled. Further, the curable material is especially not applied as a kind of film to the channel walls, but substantially the entire cross-section of the channel may be filled with curable/cured material. The channels may have a circular cross-section but the channels may also have other type of cross-sections, like square, triangular, etc. Further, the cross-section over the length of the channel may vary. For instance, when using FDM, the channel may also include e.g. voids generated during FDM printing.

Also different types of channels may be applied. In general the equivalent circular diameter ($2*\sqrt{Area/\pi}$) wherein "sqrt" is the square root) will be in the range of 0.05-100 mm, such as 0.2-50 mm, which may depend upon the size of the 3D object. As indicated above, even when complying with this equivalent circular diameter, the shape of the cross-section may vary over the channel length. In general, the total channel volume of the channels filled with cured material relative to the total volume of the printed material including the channels filled with cured material may be in the range of 0.05-20 vol. %, such as 0.5-10 vol. %. Further, in general the channel(s) will be filled with cured material in the range of at least 70 vol. %, such as at least 80 vol. %, even more especially at least 90 vol. % of the channel volume, such as substantially entirely filled with cured material.

The objects may also include different layers, such as layers comprising different chemical compositions. Such layered structure might include an inherent weakness, as the layers may tend to delaminate, e.g. under certain types of stress. Hence, in an embodiment the 3D printed object comprises two or more layers, wherein the channel is configured within at least part of a first layer and at least part of a second layer. These first and second layers may not necessarily be adjacent. Optionally one or more layers may be configured in between. In yet another embodiment, the layers are in physical contact with each other.

For further increasing reinforcement, the channel may include structures or elements which anchoring a body part to another body part. Herein, the term "body part" does not necessarily refer to a part having a distinguished function from another body part. The "term body" part may especially refer to a part of a body that may optionally be substantially identical to one or more other body parts. Suitable structures are e.g. anchor structures. Hence, in a further embodiment the channel comprises an anchoring part selected from the group consisting of a bifurcation structure and a stitch structure. With a bifurcation structure, the channel may split ("pure bifurcation") in two or three ("crossing") or more channels. A stitch structure is a kind of loop structure, optionally including knots, etc. The stitch structure may optionally be a repeating stitch structure. Hence, especially each channel may comprise one or more anchoring parts.

As indicated above, when providing the channel, especially including anchoring parts, different body parts (even while being identical in terms of composition, and even while not being distinguishable from each other), may be kept together better than without such structures. Breaking or delaminating may be prevented. However, as also indicated above, the anchoring parts may of course also be used for body parts that have different compositions or textures, etc. Hence, in a further embodiment a first anchoring part is configured in a first layer and wherein a second anchoring part is configured in a second layer, wherein the first and the second layer especially have different chemical compositions.

The channels are provided during 3D printing. The 3D printing leads to a 3D object. The product obtained between t=0 sec (the start) and the last printing action is herein also indicated as 3D object. However, sometimes this object, when it is being made, is also indicated as 3D object under construction. For instance, this nomenclature can be used to stress that the action is executed during the 3D printing process. Therefore, the 3D printing stage (further) comprises forming during 3D printing a channel in the 3D printed object under construction. Hence, in fact the channel is printed, i.e. the 3D object is printed in such a way that a channel is formed during 3D printing.

The filling of the channels may be done during printing. For instance, part of a channel is formed, or a channel is ready, and then the channel is filled with curable material, followed by an optional curing, and further 3D printing (optionally followed by curing; of course at least one curing stage is applied to cure the curable material), which further 3D printing may optionally also further include the generation of channels and filling of the channels with curable material. In yet another embodiment, however, first the object is substantially entirely 3D printed, followed by the filling of the channel(s). Hence, the method may thus further comprise (ii) a filling stage comprising filling the channel with a curable material (and curing the curable material to provide the channel with cured material).

Nevertheless, after the curing a final (3D printing) action may be executed, for instance to provide a closure layer to close an opening of the channel. Hence, in an embodiment the method further comprises (iii) a finishing stage subsequent to the filling stage, wherein the finishing stage comprises closing a channel opening, optionally also by 3D printing. Note that this finishing stage, or more precisely, the closing of the channel, is not always necessary. For instance, one may accept the fact that a cured material is visible at the end of a channel at an outer surface of the 3D object. Note that the finishing stage may optionally also include one or more of (a) heating (such as by a laser and/or a flame) at least part of the outer layer of the 3D object, (b) solvent dissolving at least part of the outer layer of the 3D object, and (c) coating at least part of the outer layer of the 3D object. Alternatively, the finishing stage may be subsequent to the filing, but before the curing. Hence, optionally curing is only done after the 3D printed object is entirely printed. Hence, optionally the filing stage and finishing stage may at least partly overlap.

The channels may be filled with a liquid (curable material), for instance by injecting a curable liquid, such as with a syringe. This curable material may especially have a relatively low (dynamic) viscosity, such as 100-1000 cP (at 20° C.) prior to curing. Additionally or alternatively, a vacuum may assist the filling. Hence, in a further embodiment the filling stage comprises subjecting the 3D printed object to sub-atmospheric pressure and subsequently filling the channel with the curable material. Alternatively or additionally, an aperture connected to the channels to be filled in the 3D printed object (under construction) can be used as a vacuum inlet.

The filling material may especially also have a low shrinkage upon curing (typically smaller than several volume %) and the coefficient of thermal expansion should especially be close to the 3D printed material in the range of possible operating temperatures of the printed device to reduce processing-induced residual stresses. Hence, especially a ratio of the thermal expansion of the printed material and of the cured material may especially be in the range of 0.6-1.4, like 0.7-1.3, such as 0.8-1.2, like 0.9-1.1. The cavities are easily introduced in the objects during the printing process by making use of the provided design freedom in additive manufacturing techniques that allow the realization of complex 3D shapes within the actual products, e.g. cork-screw or plant root like.

As indicated above, the filling material is a curable material. Curing may for instance be executed by one or more of light and heat, as known in the art. Would the 3D object include a radiation transmissive material, such as a material transmissive for one or more of UV, visible and IR radiation, also curing by light/radiation may be applied. Alternatively or additionally, heat may be applied. Hence, especially the curable material is a thermally curable material. Therefore, in an embodiment the curable material comprises a thermally curable material, and the method further comprises subjecting at least part of the 3D printed object to heat (to cure the curable material). Hence, the 3D object, when under construction and/or when finished, may be cured, e.g. by heat.

As indicated above, the method includes 3D printing. Hence, the method may thus include using a 3D printer. Herein, the 3D printer may especially include a heating element (also) having the function to heat the printed material and/or the curable material downstream from a 3D printer nozzle. This may be a heating of the printable material and/or the curable material downstream from the nozzle but not yet deposited on a receiver item (or substrate) or on (other) printed material, and/or this may be a heating of the printed material and/or the curable material. Especially, this heating may be a local heating, e.g. in a region substantially directly below the printer nozzle. Hence, in an embodiment the 3D printer further comprises a heating unit configured to heat said printed material and/or the curable material.

The invention also provides a 3D printed object obtainable (or especially obtained) with the method as described herein. Especially, in yet a further aspect the invention also provides a 3D printed object comprising a channel comprising cured material (i.e. a reinforcing structure), wherein especially the cured material has a lower stiffness than the surrounding printed material. Further, as indicated above, the channel may comprise an anchoring part selected from the group consisting of a bifurcation structure and a stitch structure. In a specific embodiment, the 3D printed object comprises two or more layers, wherein the channel is configured within at least part of at a first layer and at least part of a second layer, and wherein a first anchoring part is configured in the first layer and wherein a second anchoring part is configured in the second layer. Of course, as also indicated above, the 3D printed object may also include a plurality of such channels.

The difference in stiffness indicates that the cured material in the 3D printed object is less stiff than the surrounding 3D printed material of the 3D printed object. Hence, the curable material and the printable material are selected to provide cured material and printed material, respectively, wherein the latter has a higher stiffness than the former. The stiffness may be tested with known material analysis techniques. The stiffness of a material may be quantified in terms of Pascal or $N/m^2$, and it may relate the stress in a material to the elastic strain (by Hooke's law, which we can assume to be valid in the elastic regime of a material). Its value can be experimentally established from mechanical tests such as a tensile test, bending test, a compression test, an indentation test, etc.

The materials may be tested on such characteristics making use of standard tests or analogies thereof. Note that herein especially relative values are indicated. Examples of test which may be used, or of which analogous tests based thereon may be used are e.g. (i) tensile test: ASTM D638-10, ASTM D412-06a, ISO 37:2011, ISO 527; (ii) DMTA (dynamic mechanical thermal analysis): ASTM D4065-12, D5279-13, ASTM E2254-13, ASTM E2425-11, ISO 4664-1:2011, ISO 4664-2:2006; (iii) compression/indentation test: ASTM D575-91 (2012), ASTM E2546-07, ASTM D2240-05 (2010). Note that the curable material may also be printed. Herein, however, the term "printed material" especially refers to the non-curable material that is printed, especially with a 3D printer, in the method for the production of the 3D printed object, although the curable material may thus in some embodiments also be a "printed material". Hence, in an embodiment the surrounding printed material has a first stiffness and the cured material has a second stiffness, wherein the ratio of the second stiffness and the first stiffness is <0.8, such as <0.5, like in the range of 0.001-0.05. Hence, the cured material is more compliant. This ratio may apply for, for example, one or more of bending (the ability to bend), compression (the ability to be compressed), and indentation (the ability to be indented), etc. (see also above indicated tests). For instance, the cured material may be twice as bendable as the printed material, i.e. the stiffness is twice as low (a ratio of 0.5). Alternatively or additionally, the ability to be compressed may be higher for the cured material than for the printed material, and thus the stiffness of the printed material is higher than of the cured material, etc. Note that especially the printed material that is in physical contact with the cured material may be used to compare. Hence, by introducing channels with more pliable material, the 3D printed materials may be further kept together, like a kind of conventional stitching.

In yet a further aspect, the invention also provides a 3D printer comprising a printer head comprising a first nozzle for printing a 3D printable material to a receiver item, the 3D printer further comprising a second printer nozzle for providing a curable material, and wherein the 3D printer further comprises a curing unit configure to cure the curable material downstream from the second printer nozzle. The curing unit may include one or more of a heating unit and a radiation unit (such as for providing one or more of UV, VIS and IR radiation, especially at least UV radiation).

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily on scale.

DETAILED DESCRIPTION OF THE EMBODIMENTS

Figure 1A:
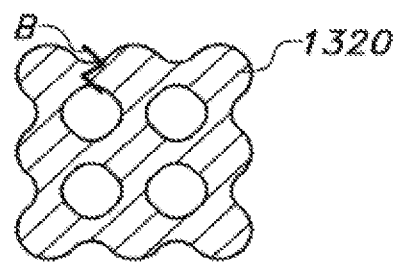
FIGS. 1a-1d schematically depict some basic aspects.
Figure 1B:
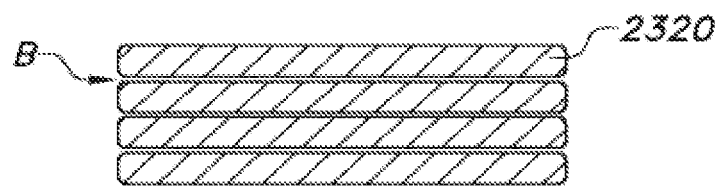
Figure 1C:
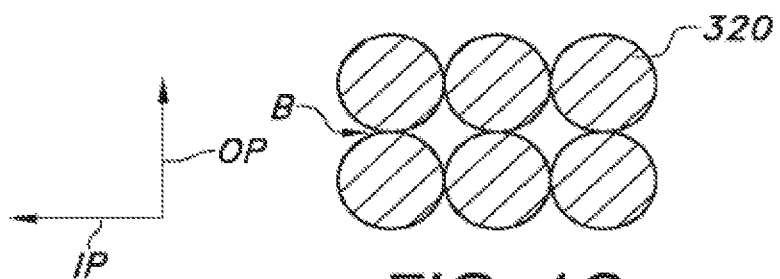
Figure 1D:
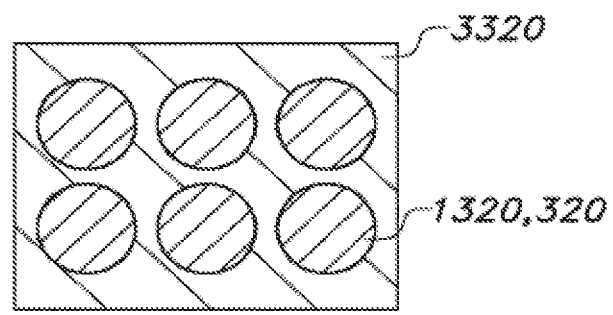

Additive manufacturing (AM) techniques based on powder sintering result in objects composed of sintered grains where the neck between grains, indicated with reference 1320, has low fracture strength, see e.g. FIG. 1a. AM based on layered processes (such as stereo lithography, sheet lamination) may result in objects composed of layers, indicated with reference 2320, where the interface between the layers represents a potential breakage line, see FIG. 1b. AM based on the deposition of filaments (Fused Deposition Modelling) result in objects composed of filaments, indicated with reference 320, where the interface between the filaments represents a potential fracture line, see FIG. 1c. In fact, due to processing and resulting temperature differences, in-plane (IP) and out-of-plane (OP) adhesion properties will vary, thereby rendering the out-of-plane properties inferior to the in-plane properties. AM based on the gluing of grains or fibers (color-jetting, Mark Forged fiber printer) result in parts composed of grains 1320 and/or fibers 320 embedded in a matrix, indicated with reference 3320. The adherence of the matrix to the grains or the fibers might be weak, see also FIG. 1d.

Possible solutions to improve e.g. in-plane and out-of-plane properties are for instance (i) reducing the effects of the heterogeneity of the structure (e.g. local heating to improve the adhesion between layers, (ii) chemical or mechanical modification of the layers surfaces to improve the adhesion, (iii) reducing the effect of the existing heterogeneity by a more continuous structure, (iv) removing or filling the voids, and (v) adding (vertical) stitches or other types of reinforcing structures, which are especially herein described.

Figure 2:
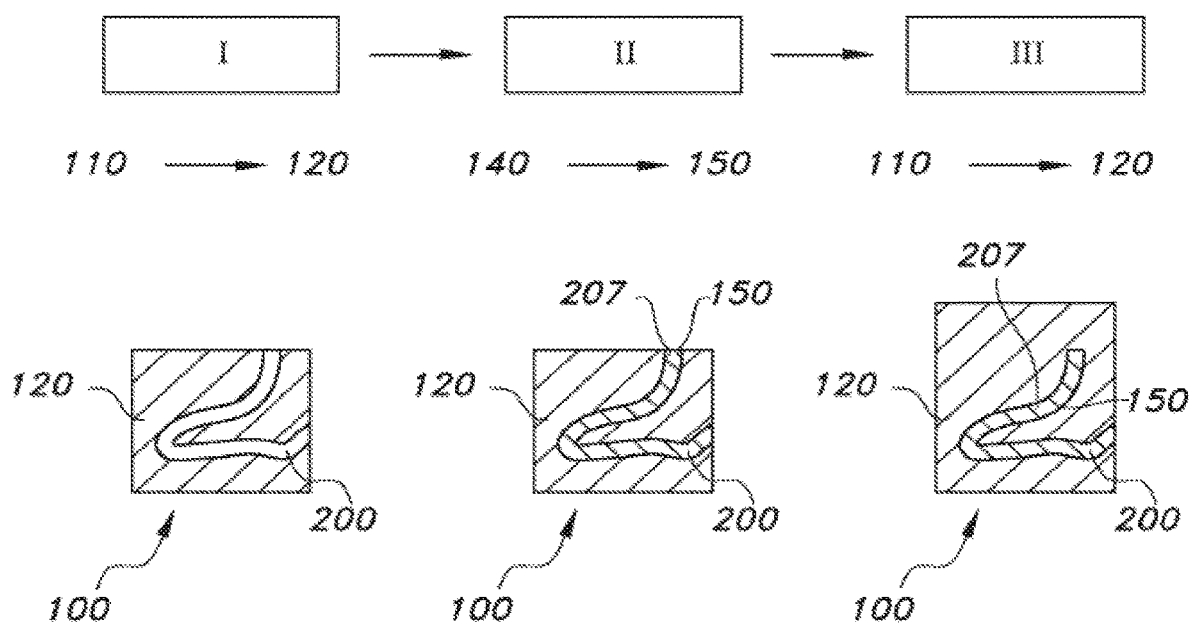
FIG. 2 very schematically show some stages and aspects of an embodiment.

FIG. 2 very schematically show some stages and aspects of an embodiment. The method comprises (i) a 3D printing stage, indicated with reference I, which may comprise 3D printing a 3D printable material 110 to provide the 3D printed object 100 of printed material 120, wherein the 3D printing stage further comprises forming during 3D printing a channel 200 in the 3D printed object 100 under construction, wherein the method further comprises (ii) a filling stage, indicated with reference II, comprising filling the channel 200 with a curable material 140 and curing the curable material 140 to provide the channel 200 with cured material 150. Optionally, the method may further comprises (iii) a finishing stage, indicated with reference III, subsequent to the filling stage II, wherein the finishing stage comprises closing a channel opening 207, optionally but not necessarily by 3D printing. Note that the stages of filling the channels and curing the material may substantially be independent. Curing does not have to occur after every filling stage, it can occur after a certain number of filling stages or maybe just once at the end—depending on the printed and curable material properties and the curing mechanism. Alternatively, if the ambient temperature is high enough, no explicit curing action might be necessary, as over time the material will cure at this elevated temperature; i.e. automatically a curing stage may be included. Especially however, the printed material is subject to a temperature over ambient temperature. As indicated above, curing may also be done after e.g. at least part of a finishing stage, e.g. a finishing stage including closing the channel 200.

Figure 3A:
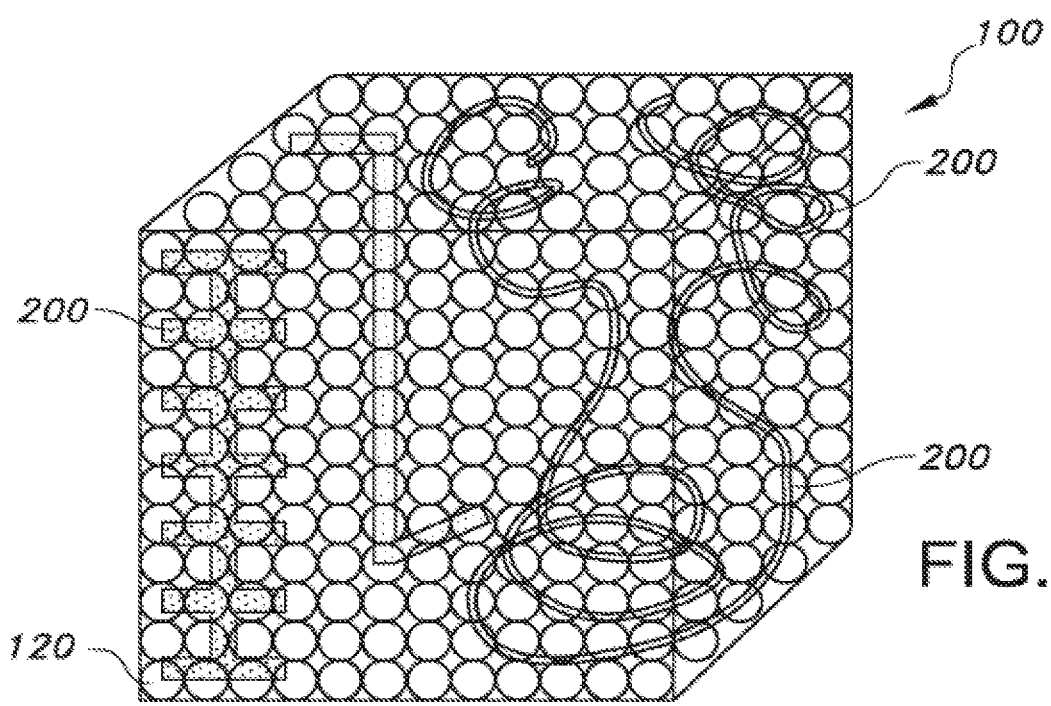
FIGS. 3a-3h schematically depict some aspects of the invention.
Figure 3B:
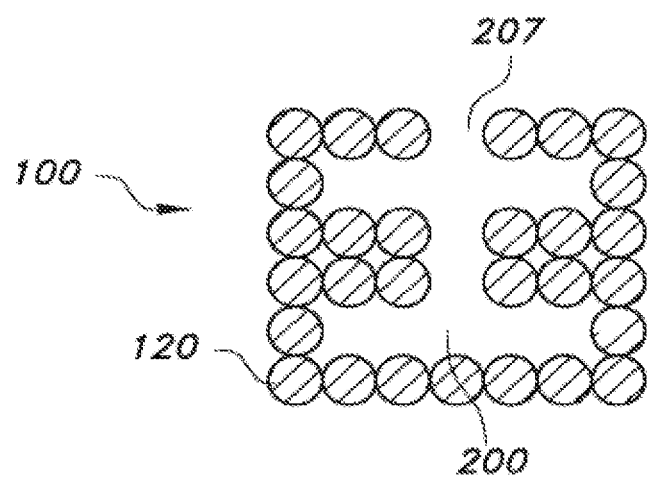
Figure 3C:
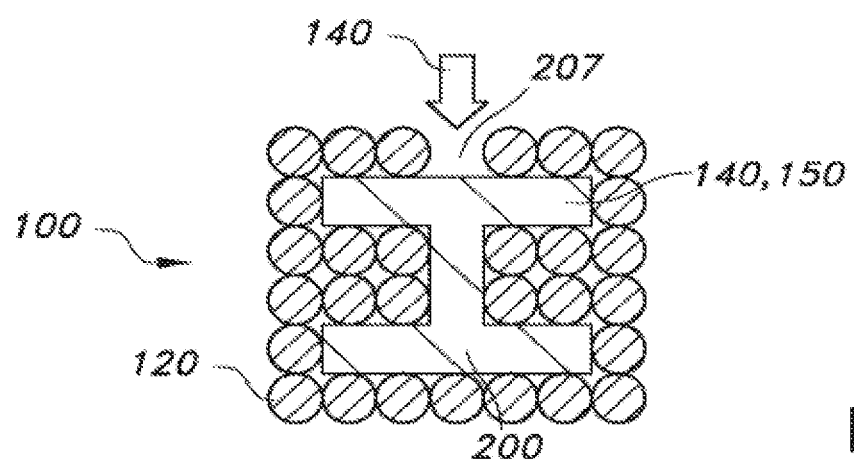

FIGS. 3a-3h schematically depict some aspects of the invention. One or several stitches, or other types of reinforcing structures, can be introduced per 3D object. The stitches or other types of reinforcing structures, can have different shapes in three dimensions, provided by the geometric design flexibility brought by AM, see e.g. FIG. 3a-3b, wherein schematically some aspects of the herein described method are depicted. FIG. 3a schematically depicts different types of channels 200 filed with cured material. These channels promoting association of different parts of the body, like conventional stitches. As can be derived from FIG. 3a, the total volume of the channels 200 can be relatively low (compared to the total volume of the 3D printed object 100). In FIG. 3a-3b, cavities are (were) introduced in the object 100 during the printing process. FIG. 3c schematically depicts that subsequently the cavity is filled with a low-viscosity material (that is curable), i.e. curable material 140.

The stitch or other types of reinforcing structure material can be e.g. silicone rubber, polysilazanes, resins, acrylates. To estimate the required properties of the insert material, numerical simulations have been performed (see below). Due to the low volume fraction of the insert material, the overall physical properties do not change significantly, though the strength of the 3D object may thus improve. The reinforcing structures comprise one or more channels, and optionally one or more anchoring parts (see below).

Figure 3D:
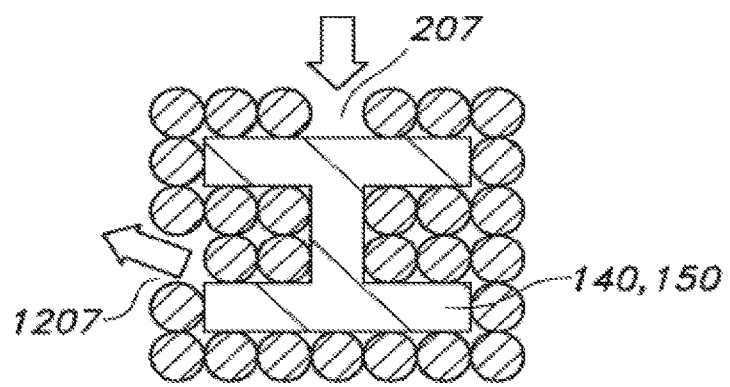

While filling the cavity, a pressure outlet 1207 may be needed, see also FIG. 3d. It is possible that the porosity in the object is enough to let air out. If not, one can introduce an air outlet during the printing process. Of course, more than one pressure outlet 1207 may be applied.

In an embodiment, the inlet 207 may also be used as air outlet or pressure outlet 1207, which is especially during the filling stage positioned on top of a part of the cavity so that the filling material does not escape, as exemplified here (see FIGS. 3b-3e). The air outlet can also be connected to vacuum in order to facilitate the filling of the cavity, allowing the use of higher viscosity material. The filling stage can be executed while the 3D object is under reduced pressure. Once the cavity is filled, the material can be cured with heat, or light (if the part is transparent to the appropriate wavelength), or reactive gas (if the part is permeable to that gas).

Figure 3E:
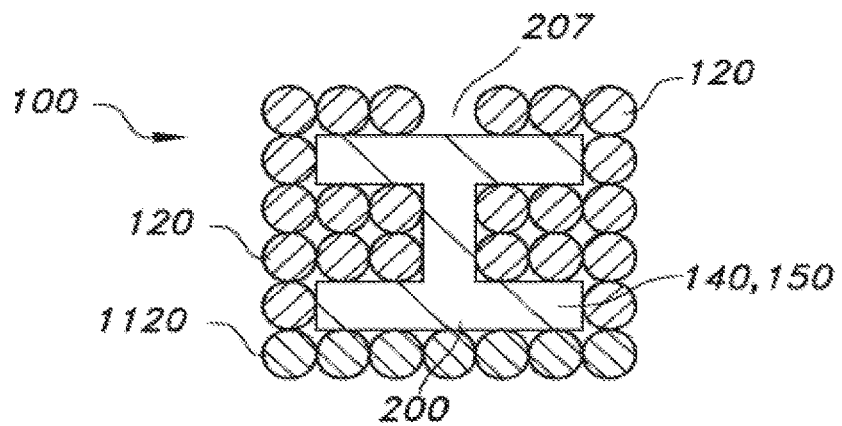

In embodiments, see e.g. FIG. 3e, the top and bottom layer of the part are not maintained by the stitch, so they may have inferior mechanical properties compared to the rest of the part. These layers can be added as sacrificial layer, indicated with reference 1120, on purpose, in a way that allows easy removal. They can be removed by polishing or dissolved if they are made from another material than the part (e.g. the top and bottom layer can be made of PVA that dissolves in water and is a standard material for support structures in Fused Deposition Modelling). This can be done during a finishing stage.

Figure 3F:
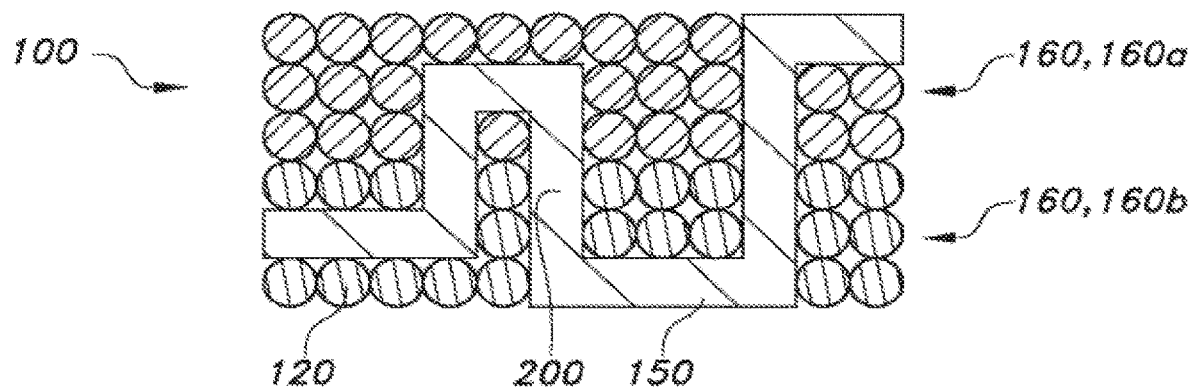

This method can also be used to improve the adherence between two materials and to "attach" two materials together that for instance might normally not adhere to each other at all, or normally have a too weak adherence, for an implementation in a product, as shown in FIG. 3f Here, the 3D printed object 100 comprises two or more layers 160, wherein the channel 200 is configured within at least part of a first layer 160a and at least part of a second layer 160b. FIGS. 3e-3f e.g. show that different body parts are associated also via the reinforcing structure.

Figure 3G:
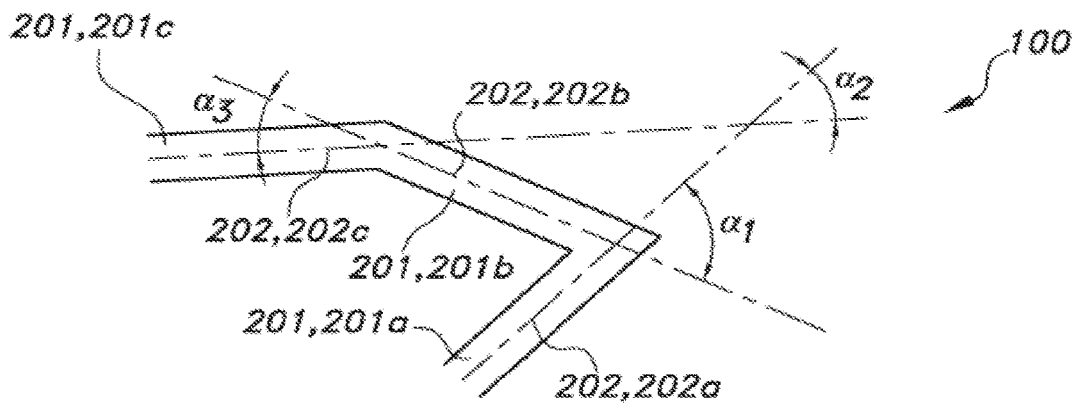
Figure 3H:
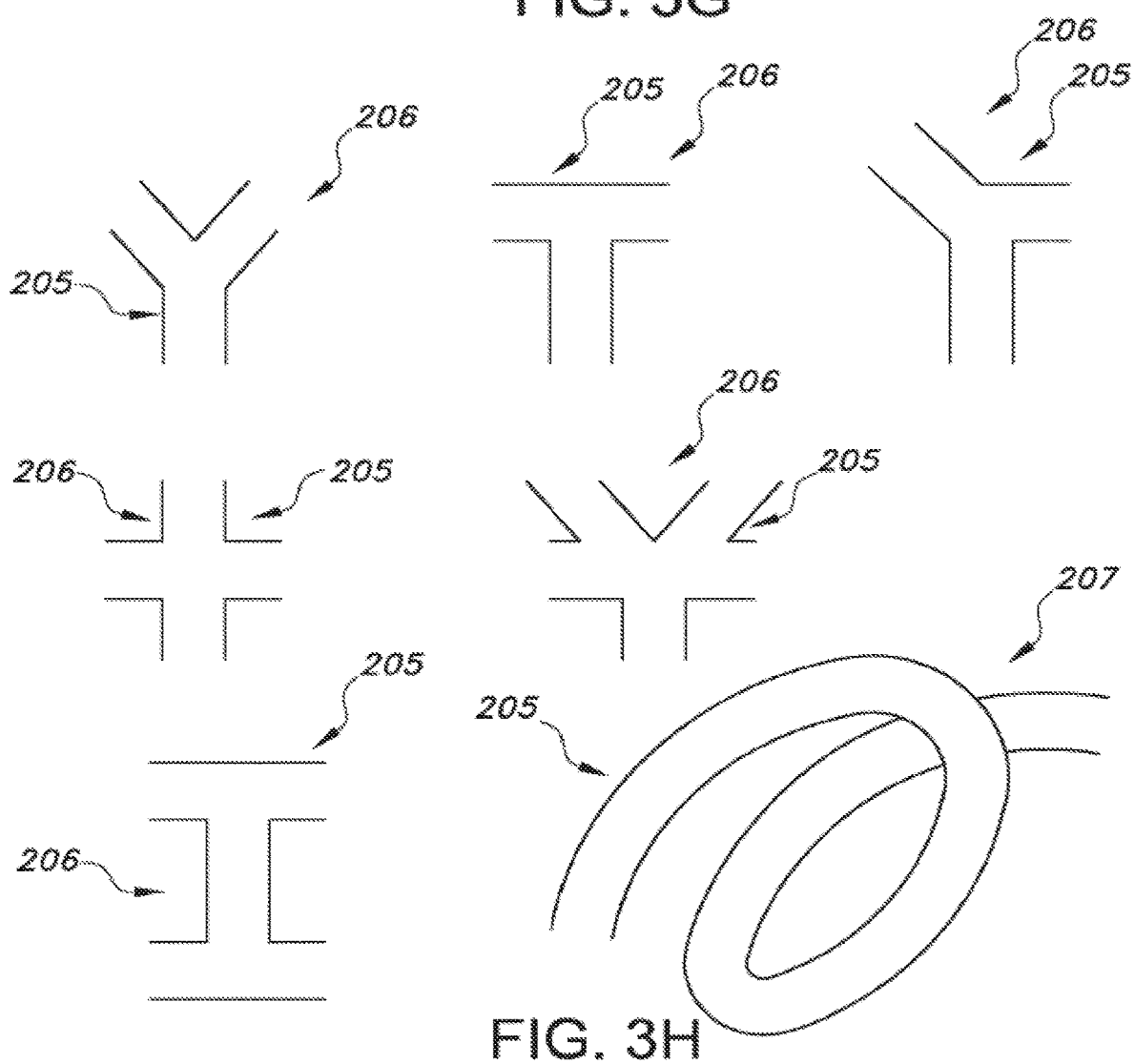

FIGS. 3g-3h further schematically depict some aspects of the invention. FIG. 3g for instance schematically depicts an embodiment of the channel 200 comprises two or more channel parts 201 forming said channel 200, wherein each channel part 201 has a channel axis 202 (herein also indicated as "channel part axis"), and wherein two or more channel axes 202 have a mutual angle α larger than 0° and smaller than 180°. Here, the channel parts are indicated with references 201a-201c and their channel (part) axes are indicated with references 202a-202c. The mutual angles are indicated with references α1-α3. Here, α1 is an acute angle; the other angles α2 and α3 are by way of example obtuse (reflex). Of course, right angles may also be possible. FIG. 3h schematically depict some embodiments of possible anchoring parts 205, such as bifurcation structures 206 and stitch structures 207. Combinations may also be used (see e.g. FIG. 3a). The anchoring parts, in combination with the channels may especially be used as reinforcing structures.

Figure 4:
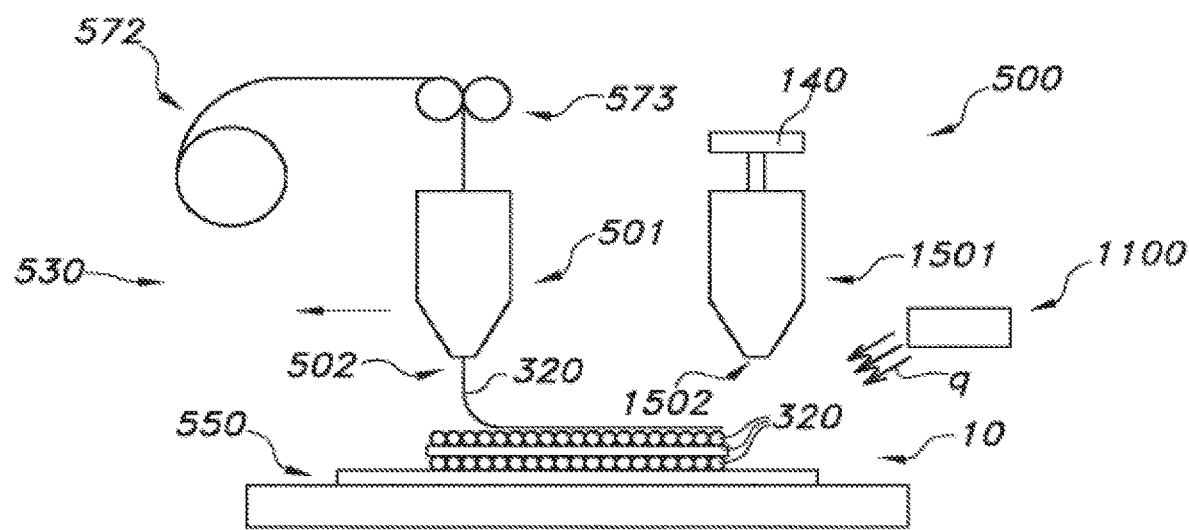
FIG. 4 schematically depict an embodiment of a 3D printer (or AM printer)

To prepare such stitches, or other types of reinforcing structures, the 3D printer machine used for (added) manufacturing may need to have an additional ink-jet or dispensing head that can be used to fill the created stitch holes with the appropriate stitching material. FIG. 4 schematically depict an embodiment of a 3D printer that might e.g. be used for the AM method as described herein. This FIG. 4 shows a 3D printer 500 comprising a printer head 501 comprising a first nozzle 502 for printing a 3D printable material 110 to a receiver item 550, the 3D printer 500 further comprising a second printer nozzle 1502 (for instance from another printer head 1501) for providing a curable material 140, and wherein the 3D printer 500 further comprises a curing unit 1100 configure to cure the curable material 140 downstream from the second printer nozzle 1502. The curing unit 1100 may for instance provide heat, indicated with the reference q. By way of example, an embodiment of an FDM printer is schematically depicted.

Reference 500 indicates a 3D printer. Reference 530 indicates the functional unit configured to 3D print, especially FDM 3D printing; this reference may also indicate the 3D printing stage unit. Here, only the printer head for providing 3D printed material, such as a FDM 3D printer head is schematically depicted. Reference 501 indicates the printer head. The 3D printer of the present invention may especially include a plurality of printer heads, though other embodiments are also possible. Reference 502 indicates a printer nozzle. The 3D printer of the present invention may especially include a plurality of printer nozzles, though other embodiments are also possible. Reference 320 indicates a filament of printable 3D printable material (such as indicated above). For the sake of clarity, not all features of the 3D printer have been depicted, only those that are of especial relevance for the present invention. The 3D printer 500 is configured to generate a 3D item 10 by depositing on a receiver item 550 a plurality of filaments 320 wherein each filament 20 comprises 3D printable material, such as having a melting point $T_m$. The 3D printer 500 is configured to heat the filament material upstream of the printer nozzle 502. This may e.g. be done with a device comprising one or more of an extrusion and/or heating function. Such device is indicated with reference 573, and is arranged upstream from the printer nozzle 502 (i.e. in time before the filament material leaves the printer nozzle 502). Reference 572 indicates a spool with material, especially in the form of a wire. The 3D printer 500 transforms this into a filament or fiber 320. Arranging filament by filament and filament on filament, a 3D item 10 may be formed. The 3D printing technique used herein is however not limited to FDM (see also above).

To illustrate the invention, numerical simulations were performed with a finite element model. A representative geometry for a typical FDM filament structure is chosen. The filaments are assumed to be ABS with stifness E=2500 MPa, Poisson's ratio v=0.4, yield strength 25 MPa and hardening modulus H=125 MPa. The adhesion between the filaments is described by so-called cohesive zone elements that define the separation between filaments by means of a traction-separation law in terms of fracture toughness ($G_c$) and fracture strength ($t_{max}$). These nonlinear elements have been applied successfully to describe interface failure in microelectronic devices. To illustrate the effect of processing (i.e. the difference in adhesion properties between in-plane and out-of-plane direction), the following adhesion properties are chosen: (a) vertical interfaces: $G_c$=8000 J/m², $t_{max}$=100 MPa; (b) horizontal interfaces: $G_c$=1000 J/m², $t_{max}$=35 MPa. The fracture toughness of the vertical interfaces is based on the actual fracture toughness of ABS. In order to load the in-plane and out-of-plane interfaces equally, equi-biaxial strain is prescribed at the right and top edges of the model, while symmetry conditions are applied at the left and bottom edge. It appeared clearly that the level of out-of-plane adhesion results in a failing interface (damage). Due to the difference in adhesion properties, only a small amount of damage is initiating at the in-plane interfaces. Clearly, these failures result in deteriorated mechanical properties of the printed structures. The resulting force-displacement curves in horizontal and vertical direction exhibit a clear instability after which the interface failure localizes in the bottom row of interfaces instead of showing a more uniform interface failure throughout the specimen. To prevent these failures from occurring, a compliant and tough material is inserted between the filaments. Due to the biaxial loading, a '+'-shape (cross-shape) of the insert material is chosen for illustration purposes of the proposed method. In reality, the cavities between the filaments and the filler material, will be filled as well. Clearly, this will improve the attachment of the filler material to the filaments due to the mechanical interlocking mechanism.

Figure 5:
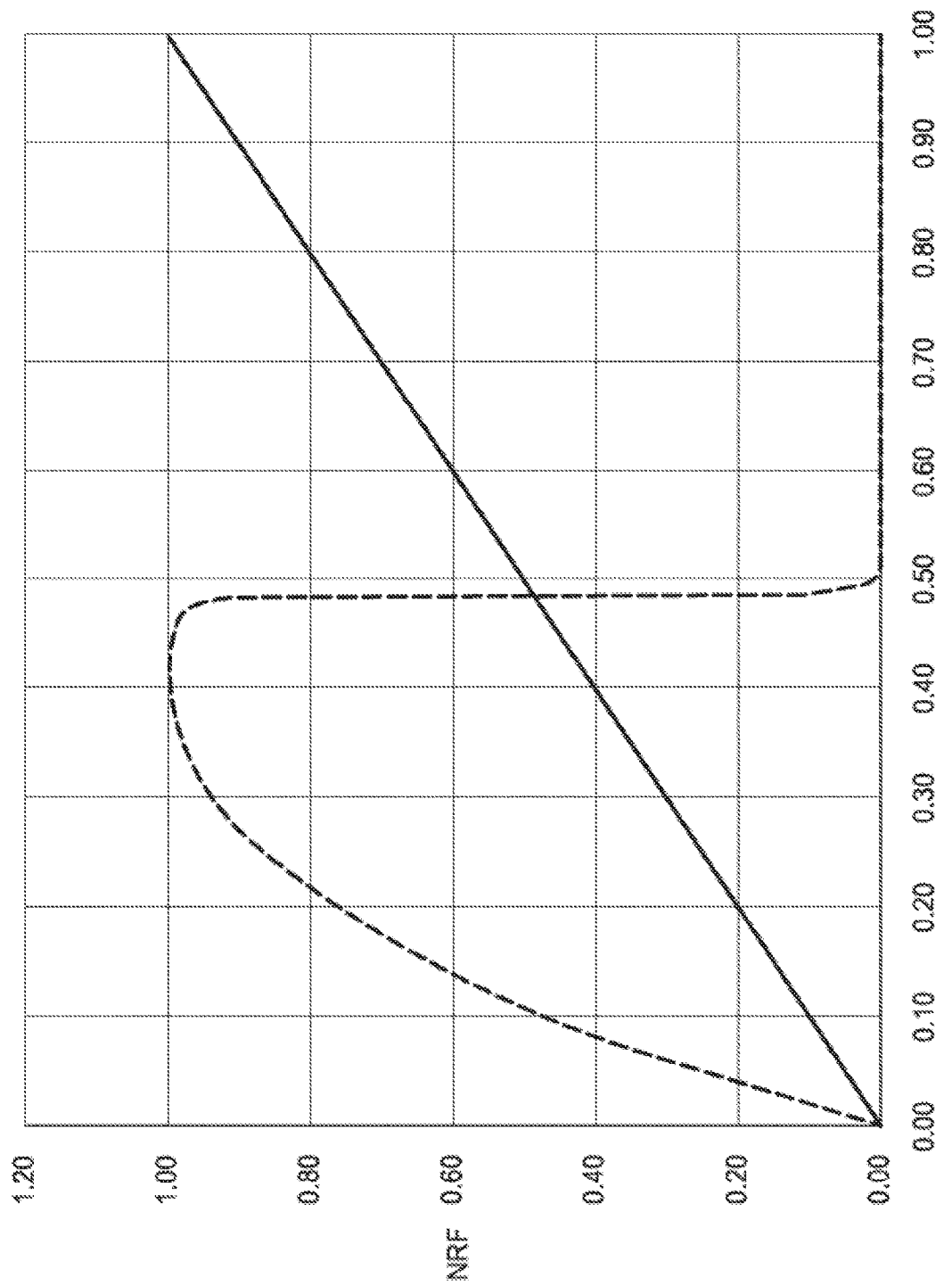
FIG. 5 show comparative results, with ND indicating the normalized displacement and NRF indicating the normalized reaction force.

The deformed geometry, as a result of the equi-biaxial loading was evaluated. It was found that the insert material with a lower stiffness than the surrounding material facilitates all deformations while the interfaces are not critically loaded. To estimate the required adhesion to prevent the insert material from detaching from the filaments, energy release rate values have been calculated at several locations at the interface between filler material and ABS. It turns out that the required level of adhesion, for this specific case, varies between 45 J/m$^2$ (for a very compliant material with E=1 MPa) up to 23 kJ/m$^2$ (for a 'stiff' polymer material with E=2000 MPa). Typical polymer-polymer interface adhesion values are in the order of several hundred J/m$^2$ (depending on the actual material combinations and surface treatments). As mentioned before, the filling of the cavities between the filaments and the filler material during processing will alleviate this requirement due to the mechanical interlocking effect and increasing adhesive surface. Clearly, each specific case results in specific demands on the insert material regarding compliance, toughness and insert geometry. The latter can be easily taken into account in the 3D design of the part. FIG. 5 shows the normalized reaction force as function of the normalized displacement for a structure without reinforcement structure (break at 0.5) and with reinforcement structure.

The term "substantially" herein, such as in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

The invention claimed is:

1. A 3D printed object comprising:
a channel comprising cured material, wherein the channel comprises two or more channel parts, each channel part having a channel axis, and two or more channel axes having a mutual angle greater than 0° and less than 180°, wherein the cured material has a lower stiffness than 3D printed material surrounding the cured material, wherein the channel further comprises an anchoring part having at least one of a bifurcation structure or a stitch structure, wherein the 3D printed object comprises two or more layers, and wherein the channel runs through a first layer of the two or more layers and through a second layer of the two or more layers, wherein the first layer is overlayed vertically on top of the second layer during 3D printing of said 3D printed object.

2. The 3D printed object according to claim 1, wherein the channel further comprises a first anchoring part and a second anchoring part, the first anchoring part being configured in the first layer and the second anchoring part being configured in the second layer.

3. The 3D printed object according to claim 1, wherein the cured material comprises a thermally cured material.

4. The 3D printed object according to claim 1, wherein the cured material comprises a light cured material.

5. The 3D printed object according to claim 1, wherein the 3D printed material surrounding the cured material has a first stiffness, wherein the cured material has a second stiffness, and wherein the ratio of the second stiffness and the first stiffness is less than 0.8.

6. The 3D printed object according to claim 1, wherein the cured material comprises one or more of a polysiloxane, a polysilazane, a polyurethane, an epoxy, a polyamide, a polyimide, a polyester, and an acrylate.

7. The 3D printed object according to claim 1, wherein the 3D printed material comprises one or more of a polymeric material selected from the group consisting of ABS, polystyrene, and polycarbonate.

8. The 3D printed object according to claim 1, wherein the anchoring part has a bifurcation structure having three or more splits.

9. The 3D printed object according to claim 1, wherein the anchoring part has a stitch structure having a loop structure.

10. The 3D printed object according to claim 9, wherein the loop structure comprises a knot.

11. The 3D printed object according to claim 1, wherein the two or more channel parts form a path that runs through three dimensions in said 3D printed object.

12. The 3D printed object according to claim 1, wherein a total channel volume of the 3D printed object filled with the cured material relative to a total volume of the 3D printed material of the 3D printed object including the cured material is 0.05-20%.

13. The 3D printed object according to claim 1, wherein a total channel volume of the 3D printed object filled with the cured material relative to a total volume of the 3D printed material of the 3D printed object including the cured material is 0.5-10%.

* * * * *